United States Patent

Tokunaga

Patent Number: 5,349,295
Date of Patent: Sep. 20, 1994

[54] MAGNETIC RESONANCE IMAGING METHOD AND APPARATUS

[75] Inventor: Yu Tokunaga, Ootawara, Japan

[73] Assignee: Kabushiki Kaisha Toshiba, Kawasaki, Japan

[21] Appl. No.: 949,700

[22] Filed: Sep. 23, 1992

[30] Foreign Application Priority Data

Sep. 25, 1991 [JP] Japan .................................. 3-245705

[51] Int. Cl.$^5$ ........................................... G01R 33/20
[52] U.S. Cl. ................................................. 324/309
[58] Field of Search ............... 324/300, 307, 309, 318, 324/322; 128/653.2, 653.5

[56] References Cited

U.S. PATENT DOCUMENTS

| | | | |
|---|---|---|---|
| 4,699,148 | 10/1987 | Gyngell | 128/653 |
| 4,769,603 | 9/1988 | Oppelt et al. | 324/309 |
| 5,078,141 | 1/1992 | Suzuki et al. | 128/653 |
| 5,148,109 | 9/1992 | Takane et al. | 324/309 |

Primary Examiner—Michael J. Tokar
Attorney, Agent, or Firm—Limbach & Limbach

[57] ABSTRACT

For the purpose of three-dimensionally imaging a selected three-dimensional region of a subject under examination on the basis of magnetic resonance phenomena exhibited by hydrogen atomic nuclei, a magnetic resonance imaging apparatus comprises a unit for carrying out the contrast enhanced-fuirier acquired steadystate technique (CE-FAST) extended to three dimensions, an image reconstruction unit for reconstructing a plurality of relatively thin slice images on the basis of echo signals from the three-dimensional region acquired by the unit, a weighting unit for weighting differently the plurality of relatively thin slice images obtained by the image reconstructing unit, an adding unit for adding slice images obtained by the weighting unit so as to produce a surface anatomy scan image of the three-dimensional region, and an image display unit for displaying the surface anatomy image obtained by the adding unit.

15 Claims, 7 Drawing Sheets

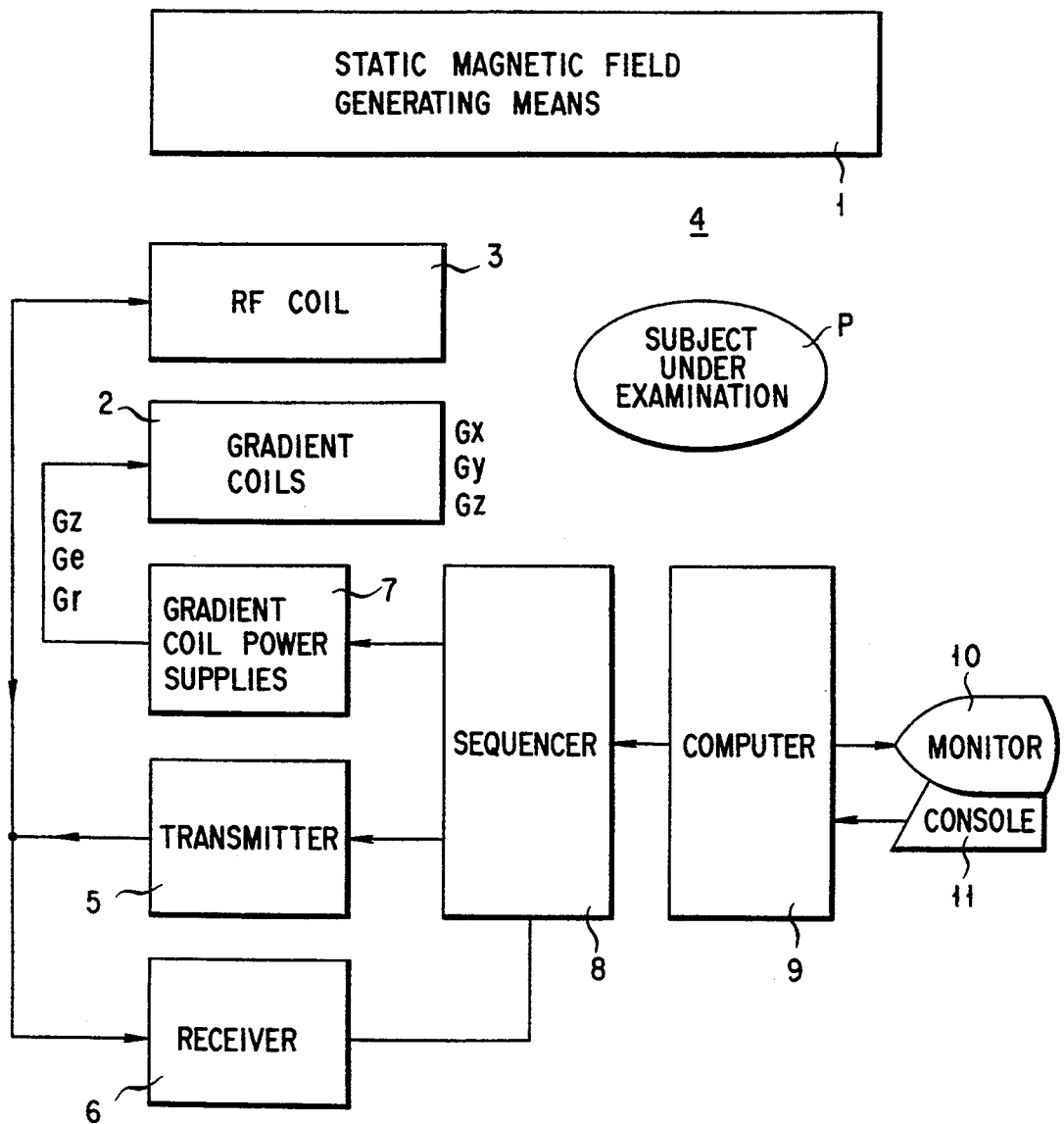
F I G. 1

MAGNETIC RESONANCE IMAGING METHOD AND APPARATUS

BACKGROUND OF THE INVENTION

1. Field of the Invention

This invention relates to magnetic resonance imaging methods of and apparatus for obtaining morphological information and functional information, such as spectroscopy, of a subject under examination utilizing magnetic resonance (MR) phenomena.

2. Description of the Related Art

A method of obtaining a surface anatomy scan (SAS) image, which is one of MR images obtained by magnetic resonance imaging apparatus, was proposed by Katada et al in 1987. A patent application for the method was filed with the Japanese Patent Office on Sep. 17, 1987 (bearing filing No. 62-232949and titled "Magnetic Resonance Imaging Method").

Subsequent researches have confirmed that such SAS images have a very important significance in the field of neurosurgery. That is, SAS images clearly indicate cortices representing brain surface structures, including brain grooves, and the positions of diseased portions locally existing under cortices. This permits a diseased portion to be located with accuracy prior to surgical treatment for cerebral disease.

There are two SAS imaging techniques. The first technique, which requires that cerebrospinal fluid (CSF) be represented to make a sharp contrast to parenchyma, uses a spin-echo method in which the echo time TE and the pulse repetition time TR are set very long and obtains an image from a single, thick slice by the use of a surface coil. The other technique, which also requires that cerebrospinal fluid be represented to make a sharp contrast to parenchyma, uses a spin-echo method in which the echo time TE and the pulse repetition time TR are set very long, acquires images from multiple slices by the use of a head coil and performs weighted addition on the resultant images.

The above-described SAS imaging techniques require an imaging time of more than ten minutes. Thus, it is difficult to perform the SAS imaging in addition to the routine imaging. To clear such a difficulty, an SAS imaging technique intended to shorten imaging time is disclosed in Japanese Unexamined Patent Publication No.2 -200241. This technique is referred to as a 2-dimension-contrast enhanced-Fourier acquired steadystate (2D-CE-FAST) technique. The CE-FAST technique is among techniques which cause steady-state free precession (SSFP) of magnetic vectors. According to the CE-FAST pulse sequence, of free induction decay (FID) signals and echo signals generated in the steady state, only the echo signals are selectively acquired, thereby permitting CSF to be represented at high level in a short time. Note that the FID signals and the echo signals are all magnetic resonance signals.

Although, of course, the above 2D-CE-FAST technique has improved imaging time over the spin-echo SAS imaging technique, there is no denying the fact that its images are lower in image quality than spin-echo SAS images. This is because nuclear magnetic moments in the steady state are dephased with respect to one another in the direction of the thickness of a slice and thus lack of uniformity of magnetic resonance signals appears on an MR image.

SUMMARY OF THE INVENTION

It is therefore an object of the invention to provide magnetic resonance imaging methods and apparatus which permit high-quality SAS images to be obtained at high speed.

According to a first aspect of the invention there is provided magnetic resonance imaging apparatus which subjects an object under examination placed in a static magnetic field to an RF pulse and gradient magnetic fields to thereby acquire echo signals from said subject and obtain a magnetic resonance image, comprising:

signal acquiring means which, in order to achieve three-dimensional imaging of a selected three-dimensional region of said subject on the basis of magnetic resonance phenomena exhibited by hydrogen atomic nuclei, repeats the application of an RF pulse corresponding to said three-dimensional region to said subject at a short pulse repetition time to thereby generate steady-state free precession magnetic resonance signals and applies a dephasing gradient magnetic field and a rephasing gradient magnetic field to signal components in said magnetic resonance signals which get in phase immediately prior to the application of the next RF pulse to thereby cause echo signals to be generated from said three-dimensional region and acquire said echo signals;

image reconstruction means for reconstructing a plurality of relatively thin slice images on the basis of said echo signals from said three-dimensional region acquired by said signal acquiring means;

image producing means for producing a surface anatomy scan image on the basis of said plurality of images of relatively thin slices obtained by said image reconstruction means; and image display means for displaying said surface anatomy image obtained by said image producing means.

According to a second aspect of the invention there is provided a magnetic resonance imaging method which subjects an object under examination placed in a static magnetic field to an RF pulse and gradient magnetic fields to thereby acquire echo signals from said subject and obtain a magnetic resonance image, comprising:

the step of signal acquisition which, in order to achieve three-dimensional imaging of a selected three-dimensional region of said subject on the basis of magnetic resonance phenomena exhibited by hydrogen atomic nuclei, repeats the application of an RF pulse corresponding to said three-dimensional region to said subject at a short pulse repetition time to thereby generate steady-state free precession magnetic resonance signals and applies a dephasing gradient magnetic field and a rephasing gradient magnetic field to signal components in said magnetic resonance signals which get in phase immediately prior to the application of the next RF pulse to thereby cause echo signals to be generated from said three-dimensional region and acquire said echo signals;

the step of reconstructing a plurality of relatively thin slice images on the basis of said echo signals from said three-dimensional region acquired by said step of signal acquisition;

the step of producing a surface anatomy scan image on the basis of said plurality of images of relatively thin slices obtained by said image reconstructing step; and the step of displaying said surface anatomy image obtained by said image producing step.

According to a third aspect of the invention there is provided a magnetic resonance imaging apparatus which subjects an object under examination placed in a static magnetic field to an RF pulse and gradient magnetic fields to thereby acquire echo signals from said subject and obtain a magnetic resonance image, comprising:

means for, in order to achieve three-dimensional imaging of a selected three-dimensional region of said subject on the basis of magnetic resonance phenomena exhibited by hydrogen atomic nuclei, carrying out the contrast enhanced-fuirier acquiered steadystate technique (CE-FAST) extended to three dimensions; image reconstruction means for reconstructing a plurality of relatively thin slice images on the basis of said echo signals from said three-dimensional region acquired by said means;

weighting means for weighting differently said plurality of relatively thin slice images obtained by said image reconstructing means;

adding means for adding slice images obtained by said weighting means to produce a surface anatomy scan image of said three-dimensional region;

image producing means for producing said surface anatomy scan image on the basis of said plurality of relatively thin slice images obtained by said image reconstruction means; and image display means for displaying said surface anatomy image obtained by said image producing means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic illustration of a magnetic resonance imaging apparatus embodying the invention;

DETAILED DESCRIPTION OF THE PREFERRED EMBODIMENTS

Figure 2:
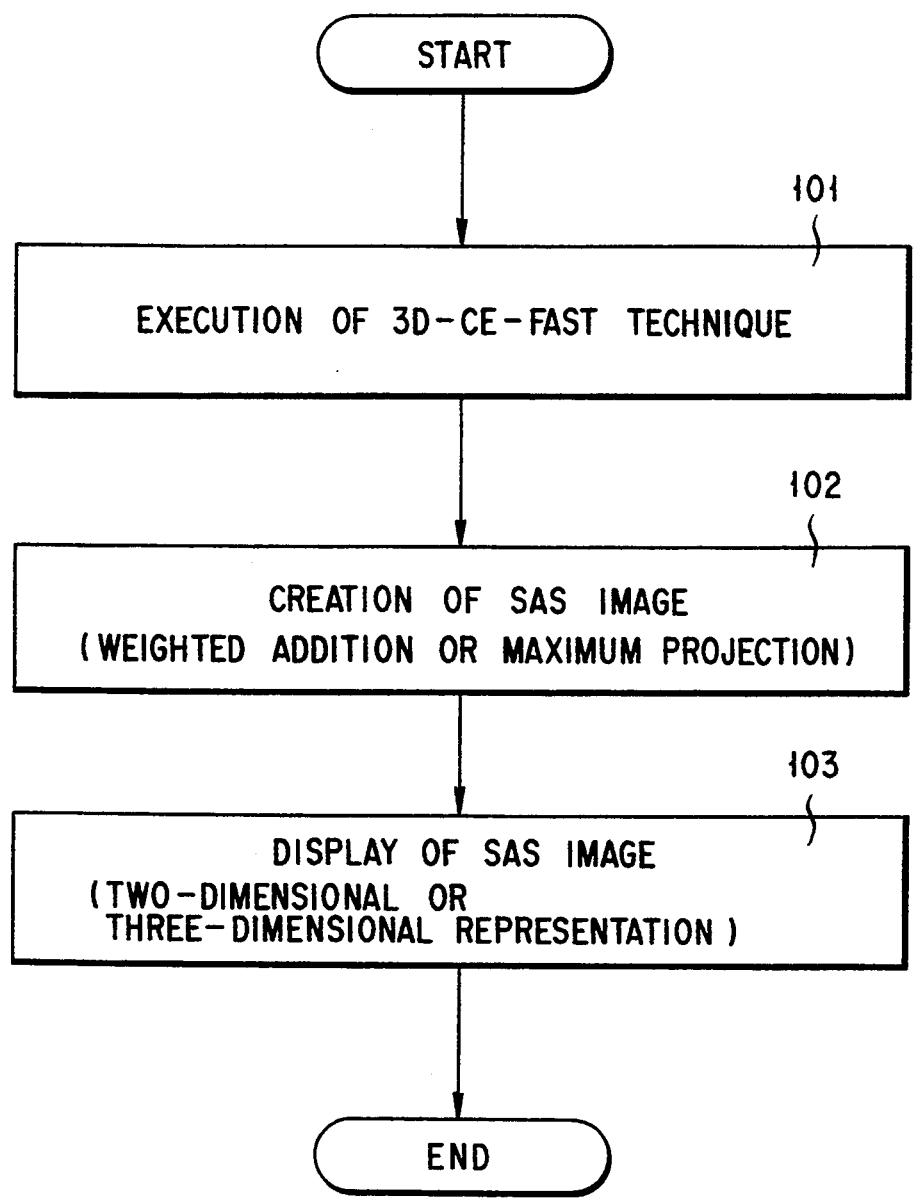
FIG. 2 is a flow chart for the magnetic resonance imaging according to the invention.

Referring now to FIG. 1, there is schematically illustrated the whole configuration of a magnetic resonance imaging apparatus embodying the invention. As shown in FIG. 1, a magnet assembly, which is indicated generally at 4 and adapted to accommodate at least a portion of a human body P under examination, comprises a superconducting or non-superconducting static magnetic field generating means 1 (a permanent magnet may be used therefor), X-, Y- and Z-axis gradient coils 2 for generating gradient magnetic fields used to provide information about position of a body portion in which magnetic resonance is induced, and an RF coil 3 for transmitting a rotating radio-frequency magnetic field (an RF pulse) and detecting magnetic resonance signals (including echo signals and FID signals) from that body portion.

The magnetic resonance imaging apparatus further comprises a transmitter 5 for controlling the transmission of an RF pulse, a receiver 6 for controlling the reception of induced magnetic resonance signals, X-, Y- and Z-axis gradient coil power supplies 7 for controlling the excitation of the respective X-, Y- and Z-axis gradient coils 2, a sequencer 8 for carrying out a pulse sequence for data acquisition, a computer 9 for controlling the respective individual components and processing and displaying detected magnetic resonance signals, a monitor 10, and a console 11.

with the apparatus of the invention, the head of the subject P under examination is placed at the center of magnetic fields generated by the magnet assembly 4 and a cylindrical coil or surface coil is disposed as the RF coil 3 to wrap around the cranium of the subject.

During a pulse sequence for data acquisition, the transmitter 5 is driven to apply an RF pulse to the subject P and magnetic resonance signals are received from the subject P. Also, the gradient field power supplies 7 are driven to cause the gradient coils 2 to apply to the subject P gradient fields Gx, Gy and Gz which are used as a slice-selection gradient field Gs, a phase-encoding gradient field Ge and a readout gradient field Gr, respectively, and signals from a selected body portion are received by the RF coil 3. This pulse sequence is repeated a predetermined number of times. As a result, a number of pieces of data are obtained and used to reconstruct an MR image.

Figure 3:
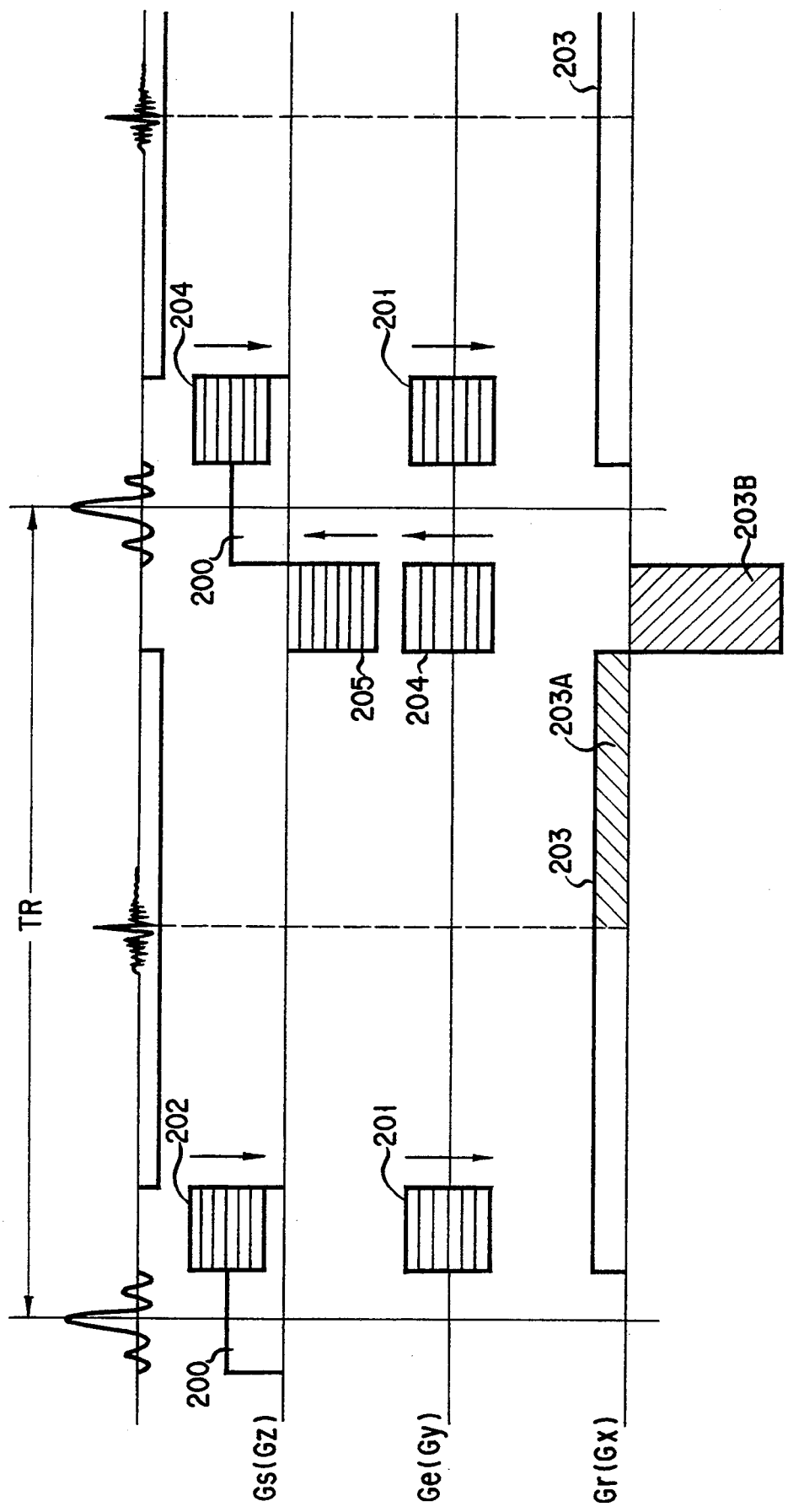
FIG. 3 illustrates a first pulse sequence for a 3D-CE-FAST technique carried out by the invention.

The present embodiment can carry out a spin-echo pulse sequence or field-echo pulse sequence for obtaining an ordinary MR image of a slice and a 3D-CE-FAST pulse sequence shown in FIG. 3 for obtaining an SAS image. This process is carried out by the sequencer 8. That is, the apparatus of the present embodiment is adapted to carry out the SAS technique illustrated by a flow chart of FIG. 2. The SAS technique is implemented by the sequencer 9 and the computer 9 controlling the transmitter 5, receiver 6 and gradient field power supplies 7. The present embodiment uses data obtained by carrying out the 3D-CE-FAST pulse sequence to reconstruct MR images of multiple slices each of which is relatively thin and performs weighted addition and maximum projection on the reconstructed MR images, thereby creating an SAS image. This process is carried out by the computer 9. As shown in FIG.

Figure 5:
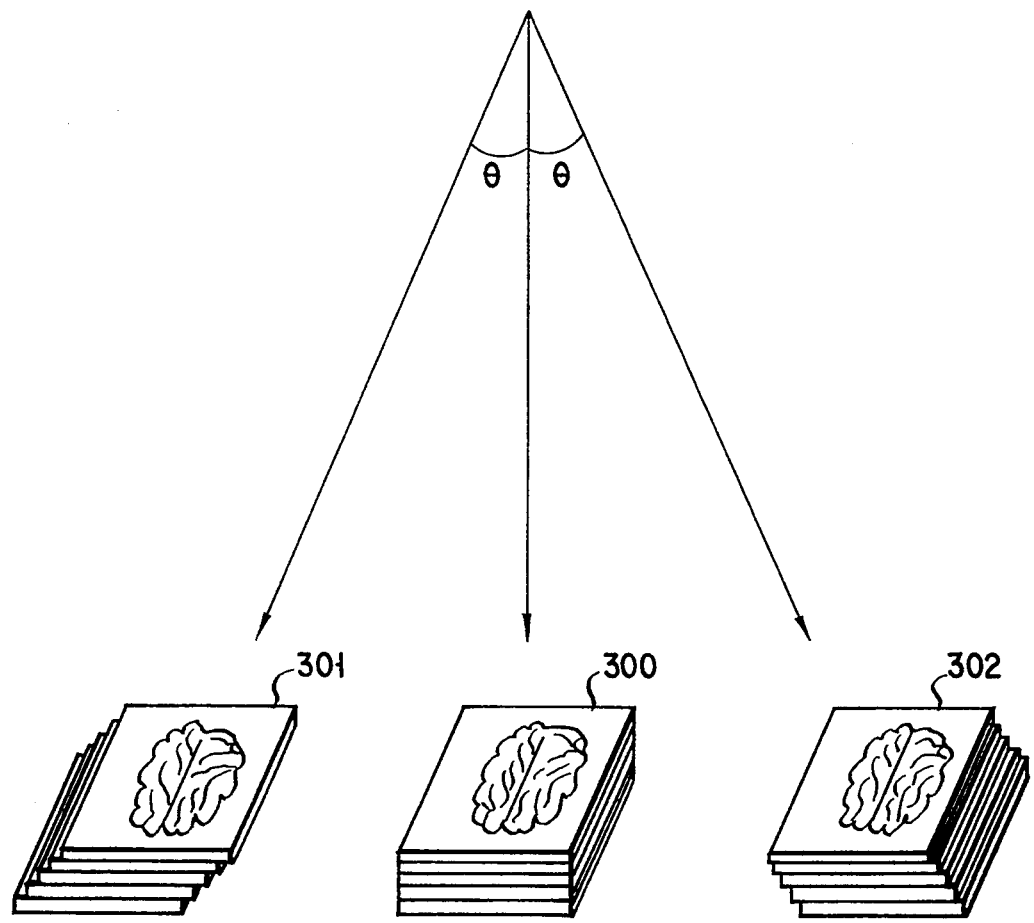
FIG. 5 illustrates a third pulse sequence for the 3D-CE-FAST technique carried out by the invention.
Figure 6:
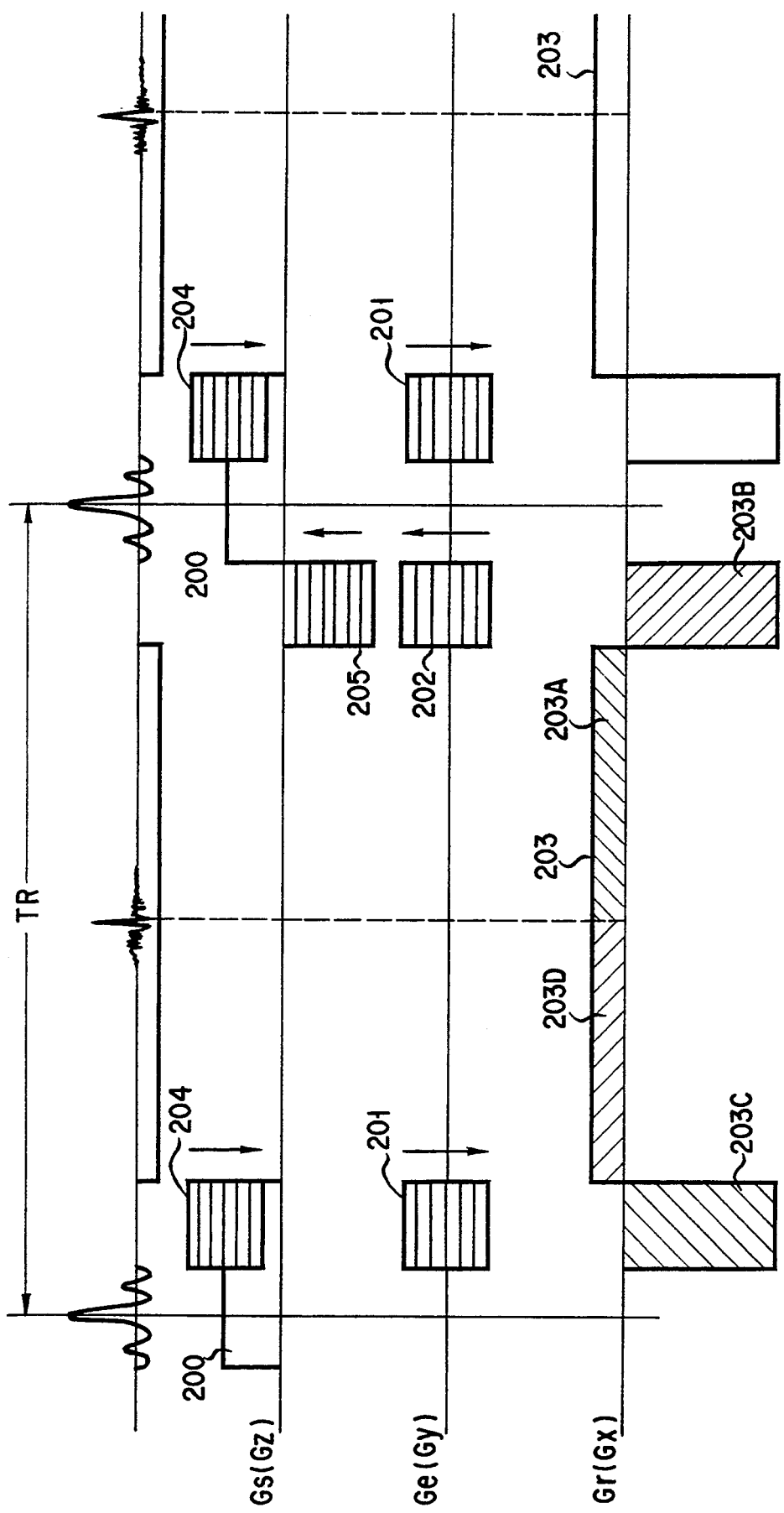
FIG. 6 is a diagram for use in explanation of weighted addition carried out by the invention.
Figure 7:
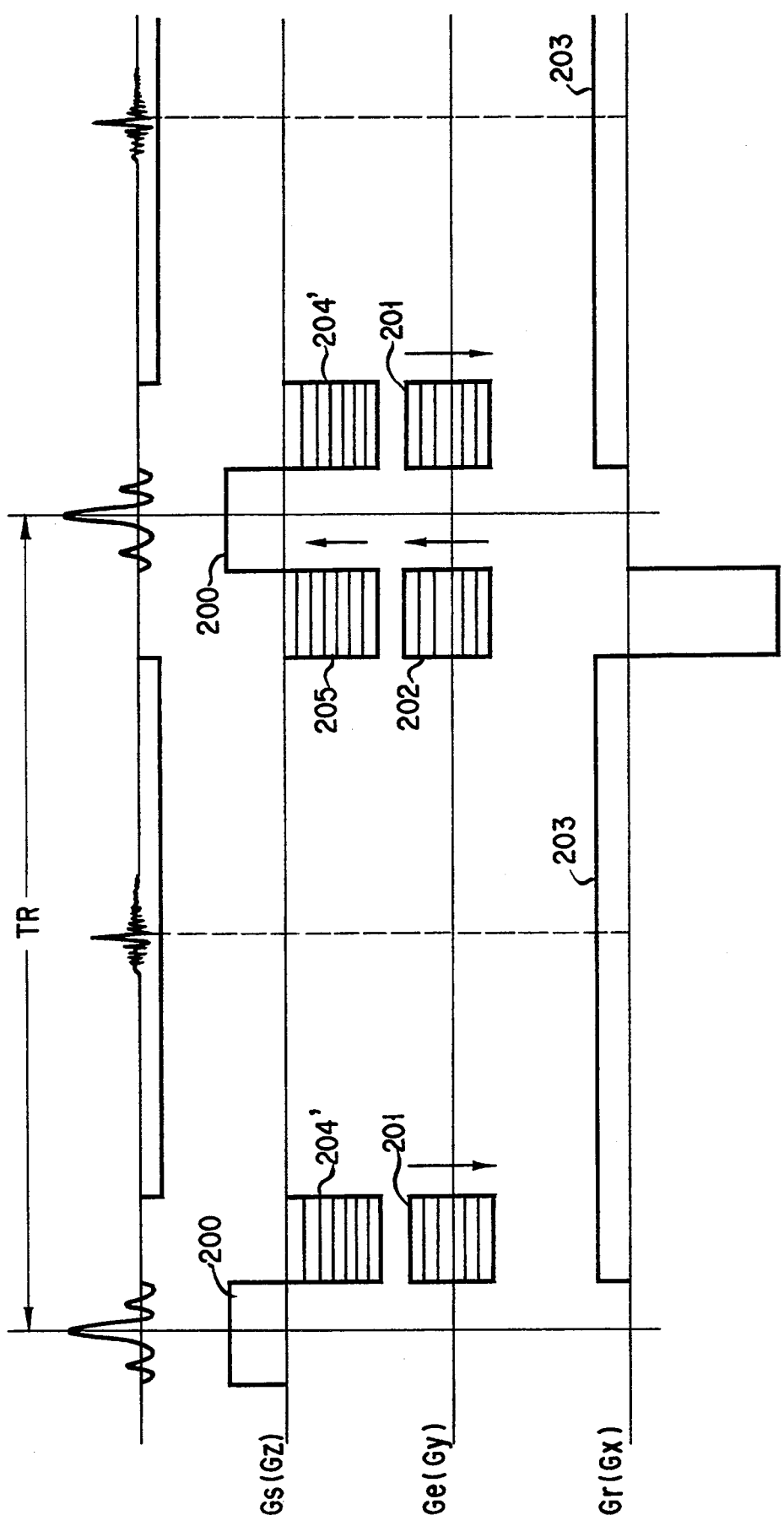
FIG. 7 illustrates stereoscopic representation of an SAS image produced by using the weighted addition.
Figure 8:
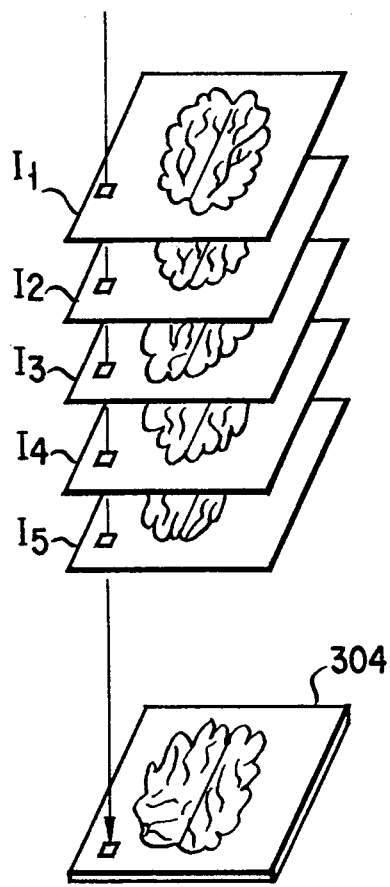
FIG. 8 is a diagrammatic representation of maximum projection carried out by the invention.
Figure 9:
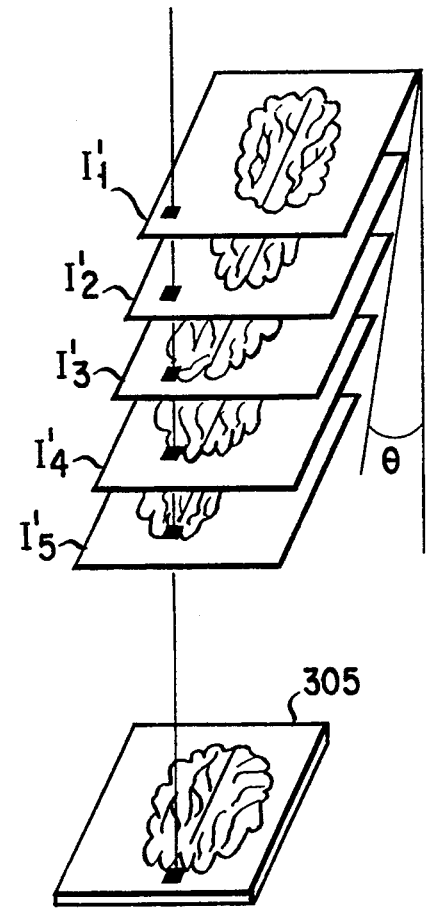
FIG. 9 illustrates a manner in which an SAS image for stereoscopic representation is produced by means of the maximum projection.

2, the 3D-CE-FAST pulse sequence shown in FIG. 3, 6 or 7 is carried out in step 101. Subsequently, the weighted addition process shown in FIGS. 4 and 5 or the maximum projection process shown in FIGS. 8 and 9 is performed in step 102, thereby creating an SAS image. Finally, a two-dimensional or three-dimensional representation of the SAS image is carried out in step 103.

The 3D-CE-FAST pulse sequence shown in FIG. 3 permits three-dimensional imaging of a selected three-dimensional region of a subject under examination. That is, the application of a 90-degree pulse that is an RF pulse for selectively exciting the three-dimensional region and a slice-selection gradient magnetic field 200 along the Gz axis to the subject is repeated at a short pulse repetition time TR. Subsequently, a Y-axis phase encoding gradient magnetic field 201 and a z-axis phase encoding gradient magnetic field 202 which are adapted for three-dimensional imaging are applied to the subject within the pulse repetition time TR. This procedure causes SSFP magnetic resonance signals to be generated from the three-dimensional region of the subject. In this case, of the magnetic resonance signals, signal components that get in phase immediately prior to application of the next 90-degree pulse are subjected to a readout gradient magnetic field Gr 203 containing a dephasing gradient field and a rephasing gradient field, thereby generating an echo signal, which is then acquired as data for image reconstruction. Note that the area of the positive portion 203A of the readout gradient magnetic field Gr 203 is set equal to that of the negative portion 203b.

As described above, in the 3D-CE-FAST pulse sequence shown in FIG. 3, the readout gradient magnetic field Gr 203 functions as the dephasing gradient field and the rephasing gradient field. The other gradient magnetic fields, i.e., the slice-selection gradient field Gs and the phase-encoding gradient field Ge, are the same as those used in the three-dimensional imaging by usual field echo techniques. The slice-selection gradient magnetic field Gs is the Z-axis gradient magnetic field Gz. The phase-encoding gradient magnetic field Ge is the Y-axis gradient magnetic field Gy. And the readout gradient magnetic field Gr is the X-axis gradient magnetic field Gx. The Z-axis phase-encoding gradient magnetic field 202 is superimposed upon the original gradient magnetic field Gz. In order to rephase spins which have been dephased by the Y-axis phase-encoding gradient magnetic field 201, a phase-encoding gradient magnetic field 204 in which its gradient is in the direction opposite to that of the gradient magnetic field 201 is applied. Further, in order to rephase spins which have been dephased by the Z-axis phase-encoding gradient magnetic field 202, a phase-encoding gradient magnetic field 205 in which its gradient is in the direction opposite to that of the gradient magnetic field 202 is applied.

In the pulse sequence shown in FIG. 3, the pulse repetition time TR is around 50 msec. The echo time TE is set at about half of the pulse repetition time TR. It is common that the slice thickness is 5 mm and the number of slices is eight. For example, assume that the pulse repetition time TR is 50 msec, the number of slices is 8, the number of elements forming a matrix is 256×256, and the averaging process for 60 additions is performed twice. Then, the imaging time will be one minute and forty-two seconds.

Figure 4:
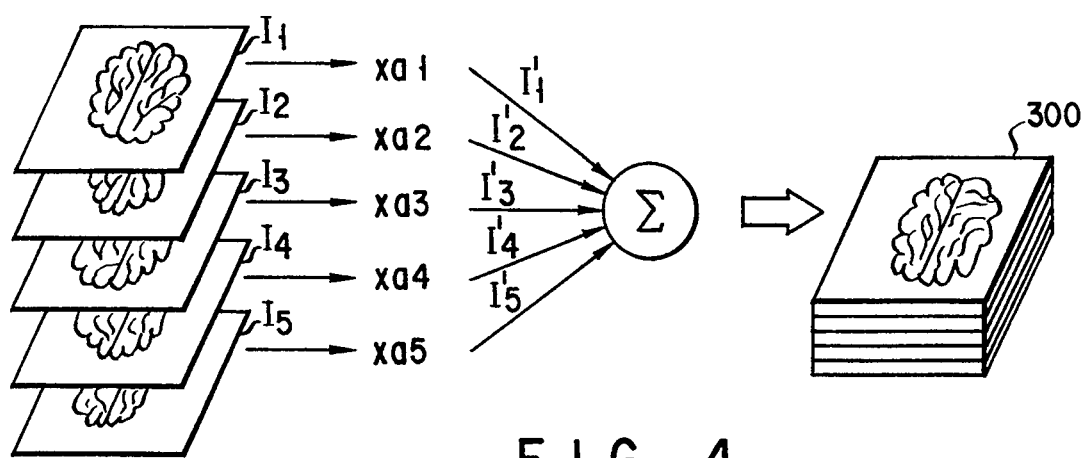
FIG. 4 illustrates a second pulse sequence for the 3D-CE-FAST technique carried out by the invention.

The weighted addition processing, which is postprocessing, is performed as shown in FIG. 4. That is, a plurality of images I1, I2, I3, I4 and I5 of slices obtained by carrying out the 3D-CE-FAST pulse sequence shown in FIG. 3 are operated on by weighting factors a1, a2, a3, a4 and a5 proportional to their distances from a brain surface, thereby obtaining weighted images I1', I2', I3', I4' and I5'. Subsequently, the weighted images are added together to obtain an SAS image.

With the conventional 2D-CE-FAST technique, irregularities occurs in image signals because of dephasing in the slice direction due to inhomogeneities in the static magnetic field. In the case of the 3D-CE-FAST technique as in the present embodiment, however, the thickness of each slice can be made thin, thus permitting a signal-irregularity-free SAS image to be obtained. The SAS image is commonly displayed two-dimensionally. A three-dimensional representation of the SAS image is also possible. That is, as shown in FIG. 7, the stereoscopic vision is made possible by creating right and left SAS images 302 and 301 viewed from the $\pm\theta$-degree direction with respect to the direction in which the above SAS image 300 is viewed in addition to the SAS image 300 and displaying them.

In the invention, the 3D-CE-FAST pulse sequences shown in FIGS. 6 and 7 can be used in addition to the pulse sequence shown in FIG. 3. The pulse sequence shown in FIG. 6 is featured by a readout gradient magnetic field Gr 203' containing a dephasing gradient field and a rephasing gradient field. That is, the readout gradient magnetic field 203' comprises first half components 203C, 203D and second half components 203A, 203B. The negative component 203C and the positive component 203 in the first half are set equal in area to each other. Likewise, the positive component 203A and the negative component 203B in the second half are set equal in area to each other. The readout gradient magnetic field 203' can bear a dephasing gradient field and a rephasing gradient field and reduce motion artifacts in the X direction in which signals are read out.

In the 3D-CE-FAST pulse sequence shown in FIG. 7, on the other hand, a phase-encoding gradient magnetic field 204', which is one of two phase-encoding gradient magnetic fields for realizing three-dimensional imaging, is superimposed upon the slice-selection gradient magnetic field Gs in opposite polarity. Such a phase-encoding gradient magnetic field 204' permits motion artifacts in the Z-axis direction, i.e., in the slice direction (direction of the slice thickness), to be reduced.

Further, in order to increase the number of original images at the time of image reconstruction, maximum projection or weighting maximum projection can be implemented using intermediate slice data calculated using the shift theorem. For example, FIG. 8 illustrates a procedure for obtaining a maximum projection image from a plurality of images I1, I2, I3, I4, and I5 obtained by carrying out the 3D-CE-FAST pulse sequence shown in FIG. 3, 6 or 8. The same position D is set for the images I1, I2, I3, I4 and I5. A comparison is made among pixel values PX1, PX2, PX3, PX4 and PX5 in the corresponding positions D of the images I1, I2, I3, I4 and I5 to select the largest pixel value. This process is performed for all of corresponding positions of the images I1, I2, I3, I4 and I5. Thus, a maximum pixel value can be collected for each of corresponding positions of the images. An image composed of only maximum pixel values is defined as a maximum projection image 304. Although this maximum projection image is commonly displayed two-dimensionally, its three-dimensional representation is also possible. That is, as shown in FIG. 9, stereoscopic vision is made possible by producing a maximum projection image 305 viewed from the θ-degree direction with respect to the slice direction as well as a normal maximum projection image viewed in the slice direction and displaying them. In this case, each of the images I1, I2, I3, I4 and I5 is shifted by an amount corresponding to the angle θ so that they overlap each other. The same processing as in FIG. 8 is performed to thereby produce the maximum projection image 305 viewed from the θ-degree direction.

As described above, the use of the CE-FAST technique permits CSF to be contrasted even if the pulse repetition time TR is short. Moreover, the implementation of the three-dimensional imaging technique in which the thickness of each slice can be made thin permits an SAS image to be obtained in which there is little phase shift and thus signal irregularities are suppressed.

According to the invention, therefore, there is provided a magnetic resonance imaging apparatus which permits high-quality SAS images to be obtained at high speed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetic resonance imaging apparatus for generating three-dimensional image of a selected three-dimensional region of a subject on the basis of magnetic resonance phenomena exhibited by hydrogen atomic nuclei, comprising:
    means for applying a plurality of RF pulses spaced apart in time to said three-dimensional region of said subject at a pulse repetition time to generate a plurality of steady-state free precession magnetic resonance signals;
    means for applying a dephasing gradient magnetic field and a rephasing gradient magnetic field between consecutive RF pulses to cause a plurality of echo signals to be generated from the plurality of steady-state free precession magnetic resonance signals of said three-dimensional region;
    means for acquiring said echo signals;
    image reconstruction means for reconstructing a plurality of relatively thin slice images on the basis of said plurality of echo signals from the plurality of steady-state free precession magnetic resonance signals of said three-dimensional region acquired by said signal acquiring means;
    image producing means for producing a surface anatomy scan image on the basis of said plurality of images of relative thin slices obtained by said image reconstruction means; and
    image display means for displaying said surface anatomy image obtained by said image producing means.

2. The magnetic resonance imaging apparatus according to claim 1, in which said signal acquiring means includes three-dimensional imaging means for three-dimensionally imaging said three-dimensional region in accordance with the contrast enhanced-fuirier acquired steadystate technique (CE-FAST).

3. The magnetic resonance imaging apparatus according to claim 2, in which said three-dimensional imaging means includes means for carrying out a CE-FAST technique using a gradient magnetic field for reducing motion artifacts in the direction of signal readout which is one of said gradient magnetic fields.

4. The magnetic resonance imaging apparatus according to claim 2, in which said three-dimensional imaging means includes means for carrying out a CE-FAST technique using a gradient magnetic field for reducing motion artifacts in the direction of thickness of slices, which is one of said gradient magnetic fields.

5. The magnetic resonance imaging apparatus according to claim 1, in which said image producing means includes weighting means for weighting differently said plurality of relatively thin slice images obtained by said image reconstructing means; and adding means for adding slice images obtained by said weighting means to produce said surface anatomy scan image of said three-dimensional region.

6. The magnetic resonance imaging apparatus according to claim 1, in which said image producing means includes means for producing said surface anatomy scan image of said three-dimensional region by applying maximum projection to said plurality of relatively thin slice images obtained by said image reconstructing means.

7. The magnetic resonance imaging apparatus according to claim 1, in which said image displaying means includes means for displaying said surface anatomy scan image obtained by said image producing means on a stereoscopic basis.

8. A magnetic resonance imaging method for generating three-dimensional image of a selected three-dimensional region of a subject on the basis of magnetic resonance phenomena exhibited by hydrogen atomic nuclei, comprising:
    the step for repeating the application of an RF pulse to said three-dimensional region of said subject at a short pulse repetition time to generate steady-state free precession magnetic resonance signals;
    the step for applying a dephasing gradient magnetic field and a rephasing gradient magnetic field to signal components in said magnetic resonance signals which get in phase [immediately prior to the application of the next between consecutive RF pulses, so as to cause echo signals to be generated from steady-state free precession magnetic resonance signals of said three-dimensional region;
    the step for acquiring said echo signal; and
    the step of reconstructing a plurality of relatively thin slice images on the basis of said echo signals from steady-state free precession magnetic resonance signals of said three-dimensional region acquired by said step of signal acquisition;
    the step of producing a surface anatomy scan image on the basis of said plurality of images of relatively thin slices obtained by said image reconstructing step; and
    the step of displaying said surface anatomy image obtained by said image producing step.

9. The magnetic resonance imaging apparatus according to claim 8, in which said signal acquiring step includes the step of three-dimensionally imaging said three-dimensional region in accordance with the contrast enhanced-fuirier acquired steadystate technique (CE-FAST).

10. The magnetic resonance imaging apparatus according to claim 9, in which said three-dimensionally imaging step includes the step of carrying out a CE-FAST technique using a gradient magnetic field for reducing motion artifacts in the direction of signal readout which is one of said gradient magnetic fields.

11. The magnetic resonance imaging apparatus according to claim 9, in which said three-dimensionally imaging step includes the step of carrying out a CE-FAST technique using a gradient magnetic field for reducing motion artifacts in the direction of thickness of slices, which is one of said gradient magnetic fields.

12. The magnetic resonance imaging method according to claim 8, in which said image producing step includes the step of weighting differently said plurality of relatively thin slice images obtained by said image reconstructing step; and the step of adding slice images obtained by said weighting step to produce said surface anatomy scan image of said three-dimensional region.

13. The magnetic resonance imaging method according to claim 8, in which said image producing step includes the step of producing said surface anatomy scan image of said three-dimensional region by applying maximum projection to said plurality of relatively thin slice images obtained by said image reconstructing step.

14. The magnetic resonance imaging method according to claim 8, in which said image displaying step includes the step of displaying said surface anatomy scan image obtained by said image producing step on a stereoscopic basis.

15. A magnetic resonance imaging apparatus to be adapted to achieve three-dimensional imaging of a selected three-dimensional region of a subject on the basis of magnetic resonance phenomena exhibited by hydrogen atomic nuclei, comprising:
  means for performing a sequence defined by the contrast enhanced-Fourier acquired steady-state technique (CE-FAST) extended to three dimensions;
  image reconstruction means for reconstructing a plurality of relatively thin slice images on the basis of said echo signals from said three-dimensional region acquired by said means;
  weighting means for weighting differently said plurality of relative thin slice images obtained by said image reconstruction means;
  adding means for adding slice images obtained by said weighting means to produce a surface anatomy scan image of said three-dimensional region;
  image producing means for producing said surface anatomy scan image on the basis of said plurality of relatively thin slice images obtained by said image reconstruction means; and
  image display means for displaying said surface anatomy image obtained by said image producing means.

* * * * *